US006623905B2

(12) United States Patent
Ray et al.

(10) Patent No.: US 6,623,905 B2
(45) Date of Patent: Sep. 23, 2003

(54) PATTERN FORMATION

(75) Inventors: Kevin Barry Ray, Morley (GB); Mark John Spowage, Swillington (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/480,250

(22) Filed: Jan. 11, 2000

(65) Prior Publication Data

US 2002/0031717 A1 Mar. 14, 2002

Related U.S. Application Data

(63) Continuation of application No. PCT/GB98/01883, filed on Jun. 26, 1998.

(30) Foreign Application Priority Data

Jul. 11, 1997 (GB) ............................................. 9714526

(51) Int. Cl.$^7$ .......................... G03F 7/022; G03F 7/004

(52) U.S. Cl. .................... 430/270.1; 430/300; 430/330; 430/945; 430/964; 430/155; 101/453; 101/465

(58) Field of Search .............................. 430/270.1, 300, 430/324, 945, 964

(56) References Cited

U.S. PATENT DOCUMENTS 4,034,183 A 7/1977 Uhlig
4,745,043 A * 5/1988 Hirai .......................... 430/203
5,122,442 A * 6/1992 Moskowitz et al. ........ 430/325
5,168,813 A * 12/1992 Riley et al. .............. 101/463.1
6,080,523 A * 6/2000 Vermeersch et al. ..... 430/270.1
6,265,136 B1 * 7/2001 Ray et al. ................... 430/302

FOREIGN PATENT DOCUMENTS

| | | |
|---|---|---|
| EP | 0557138 | 8/1993 |
| EP | 0823327 | 2/1998 |
| GB | 1511626 | 5/1978 |
| WO | WO9620429 | 7/1996 |
| WO | WO9739894 | 10/1997 |

OTHER PUBLICATIONS

English Translation of JP 58162389 (Sep. 27, 1983) (Japan).

Patent Abstracts of Japan 60132760, Jul. 15, 1985.

Patent Abstracts of Japan JP 56036075, Apr. 9, 1981.

* cited by examiner

*Primary Examiner*—Rosemary Ashton
*Assistant Examiner*—Yvette C. Thornton
(74) *Attorney, Agent, or Firm*—Faegre & Benson LLP

(57) ABSTRACT

A precursor for preparing a resist pattern comprises an imageable layer which includes a relatively volatile compound that can be volatilized by application of heat, wherein imaging radiation can be applied to the precursor to heat areas thereof and volatilizes said compound so that properties, for example, the ink accepting abilities of heated and non heated areas, are different.

23 Claims, No Drawings

PATTERN FORMATION

CROSS REFERENCE TO RELATED APPLICATIONS

This is a continuation of copending international application Serial No. PCT/GB98/01883 filed Jun. 26, 1998 which was published in English on Jan. 21, 1999, and which in turn claims priority from GB Application No. 9714526.2 filed Jul. 11, 1997.

This invention relates to the formation of a resist pattern on a substrate in the preparation of, for example, a planographic, especially a lithographic, printing member or electronic parts such as printed circuits. Particularly, although not exclusively, there is described a precursor for preparing a resist pattern; a method of preparing a said precursor; a method of preparing a member, for example a planographic printing member or electronic part; and such a member per se.

Lithographic processes involve establishing image (printing) and non-image (non-printing) areas on a substrate, substantially on a common plane. When such processes are used in printing industries, non-image areas and image areas are arranged to have different affinities for printing ink. For example, non-image areas may be generally hydrophilic or oleophobic and image areas may be oleophilic. In "wet" lithographic printing, a dampening or fountain (water-based) liquid is applied initially to a plate prior to application of ink so that it adheres to the non-image areas and repels oil based inks therefrom. In "dry" printing, ink is repelled from non-image areas due to their release property.

There are numerous known processes for creating image and non-image areas. Recently, much work has been directed towards processes which use laser imaging, in view of the ease with which lasers can be controlled digitally.

It is an object of the present invention to provide a novel precursor for preparing a predetermined resist pattern on a substrate and a method of preparing the same.

According to a first aspect of the invention, there is provided a precursor for preparing a resist pattern, said precursor comprising an imageable layer which includes means (hereinafter "said adjustment means") for adjusting a property of the imageable layer wherein said adjustment means is removable on heating areas of the imageable layer so as to change a property of heated areas relative to other areas.

Preferably, said adjustment means is for affecting the solubility of the imageable layer so that, on heating, the solubility of heated areas of the imageable layer is changed relative to other areas. As a result, said precursor can be developed after image-wise exposure to heat by removing relatively soluble areas using a solvent. Preferably, the solubility of heated areas in water is less than the solubility in water of relatively non-heated areas. As a result, said relatively non-heated areas can be removed using an aqueous solvent.

Said precursor may be for a planographic, especially a lithographic, printing member or for an electronic part such as a printed circuit.

Preferably, heated areas are arranged to define one of either ink-accepting or non-ink-accepting areas of a planographic printing member. Relatively non-heated areas are preferably arranged to define the other one of either ink-accepting or non-ink-accepting areas of the member. Ink-accepting and non-ink-accepting areas may be defined by said heating alone. For example, said adjustment means may render said imageable layer ink-accepting or non-ink-accepting but, on removal thereof, said imageable layer may be changed to the other one of either ink-accepting or non-ink-accepting. Preferably, however, said precursor is arranged to be further processed after heating to define ink-accepting and non-ink-accepting areas.

Said imageable layer preferably includes a first formulation which is preferably arranged to be ink-accepting. It preferably includes a first polymeric compound which is suitably arranged to be ink-accepting. Said first polymeric compound preferably comprises a first resin. It preferably comprises an acrylic polymer. It preferably comprises a carboxylated polymer.

Said first polymeric compound preferably has a pH of less than 7 when in water. Said first polymeric compound may be insoluble in water when the pH is 4 or less, preferably 5 or less, more preferably 6 or less. Said first polymeric compound is preferably arranged to be solubilised by raising the pH, suitably to 6 or above, preferably 7 or above.

Preferably, said first polymeric compound and said adjustment means are such that said first compound is more soluble in water when said adjustment means is present compared to when said adjustment means is not present.

Preferably, said adjustment means is more basic than said first polymeric compound.

Said adjustment means preferably comprises a base which is preferably water soluble. It may have a boiling point of at least 80° C., preferably at least 100° C., more preferably at least 125° C., especially at least 150° C. It may have a boiling point of less than 500° C., suitably less than 450° C., preferably less than 400° C., more preferably less than 375° C., especially less than 350° C.

Said adjustment means may have at least 2, preferably at least 3, more preferably at least 4 carbon atoms. Said adjustment means may have less than 20, suitably less than 18, preferably less than 16, more preferably less than 14, especially 12 or less, carbon atoms.

Said adjustment means preferably includes an amine group.

Said adjustment means preferably includes an hydroxy group.

Said adjustment means may have a general formula $NR_3$ wherein R independently represents a hydrogen atom or an optionally substituted alkyl group. Preferably, said alkyl group is a $C_{1-6}$, more preferably a $C_{1-4}$ alkyl group. Such a group may be optionally substituted with an alkyl group, especially a $C_{1-2}$ alkyl group or an hydroxy group.

Said first formulation may include a second polymeric compound which is suitably a resin. Said second polymeric compound may be provided to increase the toughness of the imageable layer after exposure compared to when the second compound is not included. Said second compound is preferably a melamine resin.

Preferably, said adjustment means is relatively volatile compared to said first formulation, especially said first polymeric compound and/or said second polymeric compound of said imageable layer described above. It is, therefore, arranged to be removed, for example evaporate, preferably on heating the imageable layer.

Preferably, the removal of said adjustment means does not involve the breaking of any covalent bonds between the adjustment means and another compound or moiety. Thus, the adjustment means used in the preparation of the imageable layer is chemically identical to the adjustment means removed on heating as in the manner described.

Said imageable layer may include a radiation absorbing means, which is preferably arranged to convert light into heat. It may comprise a black body. Carbon black is preferred.

Said imageable layer is suitably in contact with a support which may be made of a material selected from aluminium, steel, zinc and copper foils, plastics films, for example polyethylene terephthalate or cellulose acetate films and perlon gauze. The support (which is suitably hydrophilic) may be subject to a pre-treatment (electrochemical, thermal or mechanical) with the aim of appropriately adjusting its properties. The support may include a hydrophilic layer of material. This may be applied using a fluid comprising a silicate, especially sodium silicate, and particulate material, as described in applicant's co-pending PCT application No. PCT/GB96/02883 the contents of which are incorporated herein by reference. An alternative hydrophilic layer may comprise an organic compound having cationic groups, as described in EP 0 601 240, the contents of which are incorporated herein by reference. Preferred organic compounds include dextrans and pullalan wherein at least some of the hydroxy groups have been modified into one or more of —$OR^1$ or —$OCOR^2$, wherein $R^1$ represents optionally-substituted, especially by amino or quaternary ammonium, alkyl or alkylaryl, and $R^2$ represents the same as $R^1$ or alkoxy or amino groups.

Alternatively, said support may be a semiconductor or a conductor in the context of electronics circuitry.

Said adjustment means is preferably arranged to be removed by exposure to radiation in the near-IR region, suitably between 700 and 1500 nm, using a laser.

According to a second aspect of the invention, there is provided a method of preparing a precursor having an imageable layer which includes a means (herein "said adjustment means") for adjusting a property of the imageable layer when removed therefrom by heat, the method comprising applying a liquid comprising components of said imageable layer including said adjustment means to a support.

According to a third aspect of the invention, there is provided a method of preparing a member, for example a planographic printing member or an electronic part, having a predetermined resist pattern, the method including the step of causing imagewise application of heat to an imageable layer which includes a means (herein "said adjustment means") for adjusting a property of the imageable layer when removed therefrom by heat.

Said heat may be applied by imagewise exposing said imageable layer.

The method may include the step of contacting the imageable layer with a solvent in order to remove, for example by dissolution, one of either said exposed or non-exposed areas in order to define said predetermined resist pattern.

Said method is preferably for preparing a planographic printing member having ink-accepting and non-ink-accepting areas. Preferably, after application of heat and contact with said solvent, one of either said exposed or non-exposed areas is removed in order to define one of either said ink-accepting or non-ink-accepting areas.

In the method, sufficient energy is preferably supplied to remove a sufficient amount of said adjustment means in less than 5, preferably less than 1, more preferably less than 0.5, especially less than 0.1 seconds, to change a property of heated areas relative to relatively non-heated areas.

According to a fourth aspect of the present invention, there is provided a member, for example a planographic printing member, having a resist pattern defined by a first formulation as described according to said first aspect.

Said resist pattern may comprise ink-accepting and non-ink-accepting areas, wherein said ink-accepting areas are defined by a first formulation according to said first aspect.

Any feature of any aspect of any invention or example described herein may be combined with any feature of any aspect of any other invention or example described herein.

The invention will now be described by way of example.

The following products are referred to hereinafter:

GLASCOL LE15—an alkali-soluble carboxylated acrylic copolymer emulsion obtained from Allied Colloids Limited of Yorkshire, England;

LUCONYL BLACK 0066—a carbon black (40 wt. %) in water/butylglycol obtained from Basf Plc of Cheshire, England;

Beetle resin BE 340—a part methylated melamine-formaldehyde resin in solution in isobutanol (15–17 wt %) and methanol (2.2–2.8 wt %) obtained from BIP Speciality Resins Limited of West Midlands, England.

Beetle resin BE 3717—a part methylated melamine-formaldehyde resin in solution in n-butanol (15–17 wt %) and methanol (0–0.3 wt %) obtained from BIP Speciality Resins Limited of West Midlands, England.

PRINTEX 95—a furnace-type carbon black, as supplied by Degussa of Macclesfield.

EXAMPLE 1

Step 1—Preparation of Radiation-Sensitive Formulation

A formulation was prepared using the component as described in Table 1 as follows: The GLASCOL LE15 resin emulsion was diluted with water and the 2-amino-2-methyl-1-propanol (AMP) added dropwise with stirring. The mixture was barrel-rolled for 24 hours to de-aerate and then LUCONYL BLACK 0066 was added following by barrel-rolling for a further 2 hours.

Step 2—Preparation of Printing Plate

The formulation prepared in Step 1 was coated using a wire bar coater on a standard electrograined and anodised aluminium support to give a dry film weight of 5.0 to 7.0 $g.cm^{-2}$. The plate was then dried at 85° C. for 4 minutes, after which it was touch dry. (The drying temperature is of course less than the boiling point of the AMP).

EXAMPLE 2

A plate was prepared as described in Example 1 using the components described in Table 1 wherein triethanolamine (TEA) replaced AMP.

EXAMPLES 3 to 6

Plates were prepared following the procedures described in Examples 1 and 2 using the components as described in Table 1. When used, resins BE 340 and BE 3717 were added with the LUCONYL BLACK 0066. After application of the formulations, drying was effected at 80° C. for 4 minutes.

EXAMPLE 7

Step 1—Preparation of Radiation-sensitive Formulation

GLASCOL LE15 was diluted with water and TEA was added dropwise with stirring. The mixture was ball-milled for 2 hours prior to addition of PRINTEX 95 and for a further 48 hours after the addition to de-aerate. The amounts of the components are provided in Table 1.

TABLE 1

| Example No. | GLASCOL LE15 | Components (wt %) Water | AMP | TEA | LUCONYL BLACK | PRINTEX 95 | Resin BE340 | Resin BE3717 |
|---|---|---|---|---|---|---|---|---|
| 1 | 22.10 | 60.86 | 2.04 | — | 15.00 | — | — | — |
| 2 | 22.87 | 57.45 | — | 4.68 | 15.00 | — | — | — |
| 3 | 18.12 | 63.91 | 1.67 | — | 12.00 | — | 4.30 | — |
| 4 | 18.75 | 61.12 | — | 3.83 | 12.00 | — | 4.30 | — |
| 7 | 25 | 62 | — | 5 | — | 8 | — | — |
| 8 | 22.10 | 60.86 | 2.04 | — | 15.00 | — | — | — |

Step 2—Preparation of Printing Plate

This was prepared as described in Example 1, Step 2, except that drying was effected at 80° C. for three minutes.

EXAMPLE 8

This was as described in Example 1, except that the formulation was prepared to give a dry film weight of 1.2 to 1.8 g $cm^{-2}$.

Assessment of Plates

Assessment 1: Imaging using Rotatable Disc Apparatus

A plate was cut into a disc of 105 mm diameter and placed on a rotatable disc that could be rotated at a constant speed of either 100 or 2500 revolutions per minute. Adjacent to the rotatable disc, a translating table held a laser beam source so that it impinged normal to the disc (at 400 to 500 mJ $cm^{-1}$) while the translating table moved the laser beam radially in a linear fashion with respect to the rotatable disc. The exposed image was in the form of a spiral whereby the image in the centre of the spiral represented slow laser scanning speed and long exposure time and the outer edge of the spiral represented fast scanning speed and short exposure time.

The laser used was a single mode 830 nm wavelength 200 mW laser diode which was focused to a 10 micron spot. The laser power supply was a stabilised constant current source.

The plates were developed under water using gentle agitation to remove non-imaged areas.

Assessment 2: Imaging using Horizontal Bed Image Setter

A plate to be imaged was cut into a sample of not less than 1 $cm^2$ in area and placed on a flat metallic bed. Suspended above the sample was a laser scanning system which directed a focused laser beam over the sample surface by means of XY scanning mirrors (two galvanometer scanning mirrors in orthogonal planes). The included scan angle of this system was 40° capable of scanning at up to 7 rad $s^{-1}$ (or 850 mm $s^{-1}$ at the focal plane). The image to be exposed could be chosen from any image capable of being converted into vector co-ordinates via a CAD package, this including images raster scanned onto the sample surface. In the present case, plates were imaged with a ring pattern having 1.5 cm outside diameter and 0.5 cm inside diameter. The scan speed and dwell time of the laser were selectable by the operator using the scanner's control software in order to obtain various imaging energy densities.

The laser used was a single mode 830 nm wavelength 200 mW laser diode which was collimated and then focused, after reflection by the XY scanning mirrors, to do a 10 micron spot at the $1/e^2$ points. The laser power supply was a stabilised constant current source.

Assessment 3: Inking Test 0.6 to 0.7 g of conventional air drying offset lithographic printing ink was applied to an area of glass plate 15 cm×20 cm in size. This was rolled into a uniform film using a rubber roller.

A plate to be inked was rinsed in alcohol containing fountain solution and wiped using cotton wool to remove any debris. A thin film of fountain solution was left on the plate. The plate was then inked using several passes from the inked roller. The plate was then rinsed in water to remove excess ink.

Offset prints were taken by applying the inked face of the plate to a compressible lithographic blanket and rolling over with the roller. The plate was then removed and a piece of paper put in its place. The image was then transferred onto the paper by rolling over with the rubber roller.

The test was a success if a copy of the image originally on the plate was present on the paper.

Results

EXAMPLE 1

In assessment 1, a fine spiral remained of about 2.5 cm in diameter.

EXAMPLE 2

In assessment 1, a spiral which was thicker than that seen for Example 1 remained of about 1 cm in diameter.

EXAMPLES 3, 4, 5, 6 and 8

In assessment 1, spirals remained of about 3 cm, 4 cm, 3 cm, 6 cm and 10 cm diameters respectively.

EXAMPLE 7

In assessment 2, images were seen when samples had been exposed at 750 $mJcm^{-2}$. In addition, the plate successfully passed the inking test of Assessment 3.

Comments and/or Observations

Plates prepared using TEA were preferable to those prepared using AMP, this being believed to be due to the slower evaporation rate of TEA.

The addition of melamine resins (BE340 and BE3717) do not appear to affect plate speed but may increase the strength of the image area and therefore increase press run length.

A comparison of Examples 1 and 8 shows that the thinner coating of Example 8 gave a larger diameter spiral and, accordingly, the plate was more sensitive. In addition, a lower film weight is less prone to remain tacky after oven drying.

After development, plates can be baked in an oven to remove any excess amine present and increase run length.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiments). The invention extends to any novel one, or any novel combination, of the features disclosed in this specification (including any accompanying claims, abstract and drawings), or to any novel one, or any novel combination, of the steps of any method or process so disclosed.

What is claimed is:

1. A precursor for preparing a resist pattern, said precursor comprising an imageable layer which includes a component for adjusting the solubility of the imageable layer, wherein said component is removable by evaporation by heating areas of the imageable layer so as to decrease the solubility of heated areas in water relative to other areas such that the solubility of heated areas in water is less than the solubility of other areas in water and the imageable layer is developable in water to remove the other areas.

2. A precursor according to claim 1, wherein heated areas are arranged to define one of either ink-accepting or non-ink accepting areas.

3. A precursor according to claim 1, arranged to be further processed after heating to define ink-accepting and non-ink-accepting areas.

4. A precursor according to claim 1, wherein said component comprises a base which is water-soluble.

5. A precursor according to claim 1, wherein said component has a boiling point of at least 80° C.

6. A precursor according to claim 1, wherein said component has a boiling point of less than 500° C.

7. A precursor according to claim 1, wherein said component includes an amine group.

8. A precursor according to claim 1, wherein said component includes a hydroxy group.

9. A precursor according to claim 1, wherein said first polymeric compound is arranged to be solubilized by raising the pH.

10. A precursor according to claim 1, wherein said imageable layer includes a first formulation which is arranged to be ink-accepting.

11. A precursor according to claim 10, wherein said first formulation comprises a carboxylated polymer.

12. A member having a resist pattern defined by a first formulation as described in claim 10.

13. A precursor according to claim 10, wherein said first formulation includes a first polymeric compound which is arranged to be ink-accepting.

14. A precursor according to claim 13, wherein said first polymeric compound has a pH of less than 7 when in water.

15. A precursor according to claim 13, wherein said first polymeric compound is insoluble in water when the pH is 4 or less.

16. A precursor according to claim 13, wherein said first polymeric compound is arranged to be solubilized by raising the pH to 6 or above.

17. A precursor according to claim 13, wherein said component is more basic than said first polymeric compound.

18. A method of preparing a precursor having an imageable layer which includes a component for adjusting the solubility of the imageable layer wherein the component is removed by evaporation by heating areas of the imageable layer so as to decrease the solubility of heated areas in water relative to other areas such that the solubility of heated areas in water is less than the solubility of other areas in water and the imageable layer is developable in water to remove the other areas, the method comprising applying a liquid comprising said imageable layer including said component to a support.

19. A method of preparing a member, the method including the step of causing image-wise application of heat to an imageable layer which includes a component for adjusting the solubility of the imageable layer when the component is removed by evaporation by heating areas of the imageable layer so as to decrease the solubility of heated areas in water relative to other areas, such that the solubility of heated areas in water is less than the solubility of other areas in water; and developing the imageable layer in water to remove the other areas.

20. The method of claim 19, wherein said member is a planographic printing member or an electronic part having a predetermined resist pattern.

21. A method of preparing a member, the method including the step of causing image-wise application of heat to an imageable layer which includes a component for adjusting the solubility of the imageable layer when the component is removed by evaporation therefrom by heat so as to decrease the solubility of heated areas in water relative to other areas, such that the solubility of heated areas in water is less than the solubility of other areas in water; and developing the imageable layer in water to remove the other areas.

22. The method of claim 21, wherein said member is a planographic printing member of an electronic part having a predetermined resist pattern.

23. A printing member prepared by a process comprising:

(a) providing a precursor comprising an imageable layer applied to a support, wherein the imageable layer includes a component for adjusting the solubility of the imageable layer, such that the solubility of heated areas in water is less than the solubility of other areas in water, and the component being removable by evaporation by heating areas of the imageable layer so as to decrease the solubility of heated areas in water relative to other areas;

(b) imagewise exposing the imageable layer using infrared radiation, thereby evaporating the component from the exposed areas; and (c) contacting the imagewise exposed imageable layer with water, thereby removing the other areas of the imageable layer.

* * * * *